United States Patent
Mima

(10) Patent No.: US 8,866,382 B2
(45) Date of Patent: Oct. 21, 2014

(54) LIGHT-EMITTING DEVICE

(75) Inventor: Shoji Mima, Tsukuba (JP)

(73) Assignee: Sumitomo Chemical Company, Limited, Tokyo (JP)

(*) Notice: Subject to any disclaimer, the term of this patent is extended or adjusted under 35 U.S.C. 154(b) by 0 days.

(21) Appl. No.: 13/637,583

(22) PCT Filed: Mar. 25, 2011

(86) PCT No.: PCT/JP2011/057390
§ 371 (c)(1),
(2), (4) Date: Sep. 26, 2012

(87) PCT Pub. No.: WO2011/122480
PCT Pub. Date: Oct. 6, 2011

(65) Prior Publication Data
US 2013/0020924 A1    Jan. 24, 2013

(30) Foreign Application Priority Data
Mar. 29, 2010  (JP) ................. 2010-074568

(51) Int. Cl.
*H05B 33/06* (2006.01)
*H01L 51/52* (2006.01)

(52) U.S. Cl.
CPC .......... *H01L 51/529* (2013.01); *H01L 51/5221* (2013.01); *H01L 51/5206* (2013.01)
USPC ....................................... 313/506

(58) Field of Classification Search
USPC .................... 313/500–506; 257/40
See application file for complete search history.

(56) References Cited

U.S. PATENT DOCUMENTS

| 2005/0001247 | A1  | 1/2005 | Ozawa et al. |         |
|--------------|-----|--------|--------------|---------|
| 2006/0061272 | A1* | 3/2006 | McCormick et al. | 313/512 |
| 2007/0045616 | A1* | 3/2007 | Tokuda et al. | 257/40 |
| 2011/0096504 | A1  | 4/2011 | Hild |         |

FOREIGN PATENT DOCUMENTS

| JP | 2002-343559 A | 11/2002 |
| JP | 2003-272856 A | 9/2003 |
| JP | 2006-210216 A | 8/2006 |
| JP | 2007-026970 A | 2/2007 |

(Continued)

OTHER PUBLICATIONS

International Search Report of PCT/JP2011/057390 dated May 17, 2011.

(Continued)

*Primary Examiner* — Anh Mai
*Assistant Examiner* — Brenitra M Lee
(74) *Attorney, Agent, or Firm* — Sughrue Mion, PLLC

(57) ABSTRACT

A purpose of the present invention is to provide a light-emitting device having a high heat dissipation property.

The light-emitting device of the present invention includes: a supporting substrate; an organic EL element including a first electrode, an organic EL layer and a second electrode being stacked in this order on the supporting substrate; a first extracting electrode for electrically connecting to an external electric power supply, that is extended from the first electrode on the supporting substrate; a second extracting electrode for electrically connecting to an external electric power supply, that is arranged on the supporting substrate to be away from the first electrode and the first extracting electrode; a connecting electrode that is extended from the second electrode and is connected to the second extracting electrode, on the supporting substrate; and a first heat-dissipating member that is extended from the second electrode and is electrically insulated from the first electrode and the first extracting electrode, on the supporting substrate.

7 Claims, 5 Drawing Sheets

(56) References Cited

FOREIGN PATENT DOCUMENTS

| JP | 2008-010211 A | 1/2008 |
|---|---|---|
| JP | 2008-251551 A | 10/2008 |
| JP | 2010536155 A | 11/2010 |
| WO | 2009/021741 A2 | 2/2009 |

OTHER PUBLICATIONS

Japanese Office Action issued in corresponding JP Application No. 2010-074568, dated Mar. 4, 2014.

* cited by examiner

LIGHT-EMITTING DEVICE

TECHNICAL FIELD

The present invention relates to a light-emitting device.

BACKGROUND ART

For a light-emitting device, there are various types of devices having a different light source. As one of the different light-emitting devices, a light-emitting device employing an organic electroluminescent element (hereinafter, sometimes referred to as an organic EL element) as a light source is being put to practical use, currently.

An organic EL element generates heat during use, thus the temperature of the organic EL element increases. Temperature increasing of the organic EL element during use of the light-emitting device facilitates deterioration to the organic EL element itself. To this, various studies on heat dissipation have been conducted for suppression of temperature increasing in the organic EL element working as a light-emitting source in a light-emitting device. Conventionally, as a solution for heat dissipation in such a light-emitting device, for example a heat-dissipating member having high thermal diffusivity is provided on an organic EL element. In conventional techniques, in order to enhance a thermal diffusivity of the heat-dissipating member, the heat-dissipating member is formed from a metal having a high thermal diffusivity and is formed so as to have concave-convex portions on the surface of itself for increasing its surface area (see Patent Document 1, for example).

RELATED ART DOCUMENTS

Patent Document

Patent Document 1: JP 2002-343559 A

DISCLOSURE OF INVENTION

Problem to be Solved by the Invention

Providing a heat-dissipating member as in conventional techniques has not been always enough to achieve a sufficient heat dissipation property, and accordingly the heat dissipation property of a light-emitting device needs to be further improved. Therefore, a purpose of the present invention is to provide a light-emitting device having a high heat dissipation property.

Means for Solving Problem

The present invention provides a light-emitting device described below.

[1] A light-emitting device, comprising:
a supporting substrate;
an organic electroluminescent element comprising a first electrode, one or more organic electroluminescent layers and a second electrode that are layered in this order on the supporting substrate;
a first extracting electrode for electrically connecting to an external electric power supply, that is extended from the first electrode on the supporting substrate;
a second extracting electrode for electrically connecting to an external electric power supply, that is arranged away from the first electrode and the first extracting electrode on the supporting substrate;
a connecting electrode that is extended from the second electrode and connected to the second extracting electrode on the supporting substrate; and
a first heat-dissipating member that is extended from the second electrode and insulated electrically from the first electrode and the first extracting electrode on the supporting substrate.

[2] The light-emitting device according to [1], further comprising a second heat-dissipating member extended from the connecting electrode on the second extracting electrode.

[3] The light-emitting device according to [1] or [2], wherein
a part or all of the first heat-dissipating member is arranged in a manner of overlapping with the first extracting electrode as viewed from a thickness direction of the supporting substrate, and
an electrically-insulating film is arranged between the first heat-dissipating member and the first extracting electrode on an area where the first heat-dissipating member and the first extracting electrode overlap, as viewed from a thickness direction of the supporting substrate.

[4] The light-emitting device according to any one of [1] to [3], wherein a product of a thermal conductivity and a thickness of the second electrode is larger than that of the first electrode.

[5] The light-emitting device according to any one of [1] to [4], further comprising a subsidiary heat-dissipating member that is arranged in contact with the first extracting electrode, wherein a product of a thermal conductivity and a thickness of the subsidiary heat-dissipating member is larger than that of the first extracting electrode.

[6] The light-emitting device according to any one of [1] to [5], wherein a thermal conductivity of the second electrode is equal to or more than 30 W/m·k.

[7] The light-emitting device according to any one of [1] to [6], wherein a thickness of the second electrode is equal to or more than 100 nm.

Effect of the Invention

According to the present invention, a light-emitting device with a high heat dissipation property can be provided.

DESCRIPTION OF EMBODIMENTS

An embodiment of the present invention is described below. In the description below, a term "electroluminescent" used in "organic electroluminescent layer" or "organic electroluminescent element" is abbreviated as "EL" in some cases.

A light-emitting device of the present invention comprises: a supporting substrate; an organic EL element composed by disposing a first electrode, one or more organic EL layers and a second electrode in this order on the supporting substrate; a first extracting electrode for electrically connecting to an external electric power supply, that is extended from the first electrode on the supporting substrate; a second extracting electrode for electrically connecting to an external electric power supply, that is arranged on the supporting substrate to be away from the first electrode and the first extracting electrode; a connecting electrode that is extended from the second electrode and is connected to the second extracting electrode, on the supporting substrate; and a first heat-dissipating member that is extended from the second electrode and is electrically insulated from the first electrode and the first extracting electrode, on the supporting substrate.

First Embodiment

Structure of Light-Emitting Device

Figure 1A:
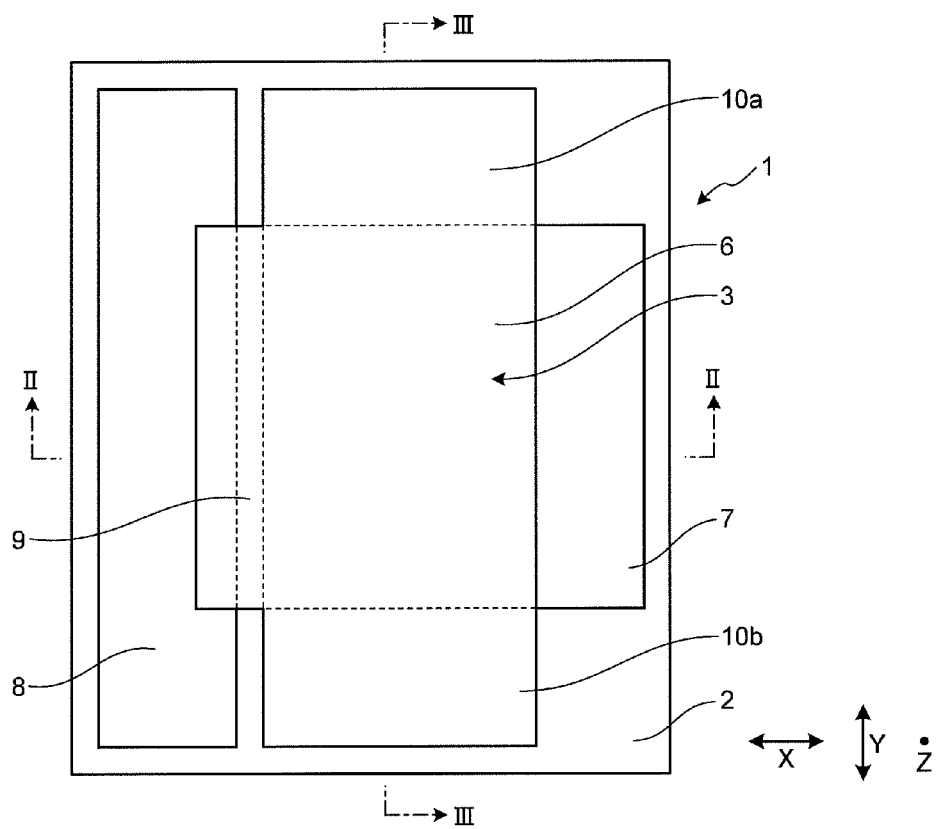
FIG. 1A is a plan view to schematically illustrate the light-emitting device 1 of a first embodiment of the present invention.
Figure 1B:
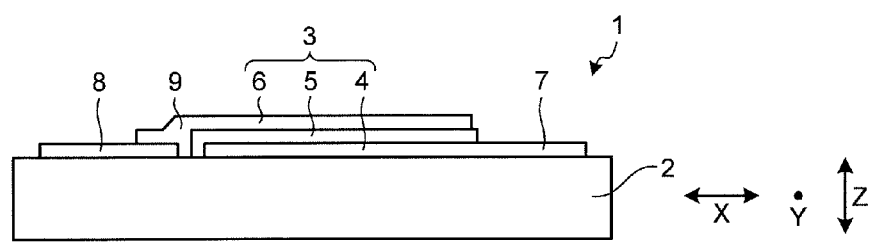
FIG. 1B is a cross-sectional view of the light-emitting device 1 of a first embodiment of the present invention at a cross-sectional line II-II in FIG. 1A.
Figure 1C:
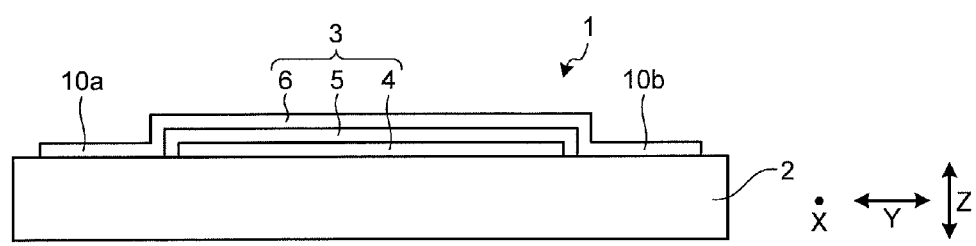
FIG. 1C is a cross-sectional view of the light-emitting device 1 of a first embodiment of the present invention at a cross-sectional line III-III in FIG. 1A.

First, the structure of a light-emitting device is explained. FIGS. 1A, 1B, and 1C are each a view to schematically illustrate a light-emitting device 1 of a first embodiment of the present invention. FIG. 1A is a plan view of the light-emitting device 1, FIG. 1B is a cross-sectional view of the light-emitting device 1 at a cross-sectional line II-II in FIG. 1A, and FIG. 1C is a cross-sectional view of the light-emitting device 1 at a cross-sectional line III-III in FIG. 1A. A light-emitting device may be provided with a single organic EL element, or may be provided with a plurality of organic EL elements. In the present embodiment, a structure of a light-emitting device provided with one organic EL element is explained as one example.

A light-emitting device 1 is provided with a supporting substrate 2 and an organic EL element 3 that is provided on the supporting substrate 2. The organic EL element 3 comprises a first electrode 4, an organic EL layer 5 and a second electrode 6, which are layered in this order on the supporting substrate 2. In the present specification, a portion in which all the layers constituting the organic EL element 3 overlap as viewed from a thickness direction Z of the supporting substrate 2 (hereinafter, also referred to as "in a planar view") is referred to as the organic EL element 3. That is, in the present specification, a portion in which all of the layers of the first electrode 4, the organic EL layer 5 and the second electrode 6 are layered wherein the portion emits light as viewed from the thickness direction Z of the supporting substrate 2 is referred to as the organic EL element 3. As described below, in a light-emitting device of the present invention, although a component that is extended from the first electrode 4 or the second electrode 6 is provided, only the portion that constitutes the organic EL element 3 and works as an electrode is expressed as the first electrode 4 or the second electrode 6 in the present specification. In the present specification, the name for a component extended from the first electrode 4 or the second electrode 6 and not constituting a part of the organic EL element is expressed differently from the first electrode 4 or the second electrode.

One of the first electrode 4 and the second electrode 6 is composed of an electrode having light transparency. The present invention can be applied to either case of an organic EL element in which the first electrode 4 is composed of an electrode having light transparency and an organic EL element in which the second electrode 6 is composed of an electrode having light transparency. In the present embodiment, an organic EL element in which the first electrode 4 is composed of an electrode having light transparency is explained as one example. That is, a so-called bottom emission type organic EL element is explained, in which light passes through the first electrode 4 and the supporting substrate 2 and emits from a light-emitting device to the outside. When providing a bottom emission type organic EL element on the supporting substrate, a supporting substrate also needs to be composed of a component having light transparency.

The organic EL element 3 is provided with one or more organic EL layers 5. Here, an organic EL layer means any layer interposed between the first electrode 4 and the second electrode 6. The organic EL element 3 is provided with at least one or more light-emitting layers as the organic EL layer 5. Also, between the electrodes 4 and 6, a prescribed layer is provided as necessary in addition to the light-emitting layer. For example, between an anode and a light-emitting layer, a hole injection layer, a hole transport layer, an electron block layer, and the like are provided as the organic EL layer. Also, between the light-emitting layer and a cathode, a hole block layer, an electron transport layer, an electron injection layer, and the like are provided as the organic EL layer.

As illustrated in FIGS. 1B and 1C, the organic EL layer 5 in the present embodiment is provided on the first electrode 4 and also provided so as to extend from the periphery of the first electrode 4. That is, the organic EL layer 5 is formed so as to cover the first electrode 4 in a planar view. By providing the organic EL layer 5 according to the above-mentioned shape, undesired conduction between a conductive component such as the first electrode 4 and other components can be prevented as described below.

The light-emitting device 1 is provided further with a first extracting electrode 7. The first extracting electrode 7 works as an electrode that is electrically connected to an external electric power supply. The first extracting electrode 7 is provided on the supporting substrate 2 to be extended from the first electrode 4. That is, the first extracting electrode 7 is integrally formed with the first electrode 4. For example, the first extracting electrode 7 is electrically connected to an external electric power supply by a connector, a bonding wire or the like, when the light-emitting device 1 is installed in a certain device. As a result, electric power from the electric power supply is supplied to the first electrode 4 through the first extracting electrode 7. Hereinafter, a direction in which the first extracting electrode 7 extends from the first electrode 4 is also referred to as a first direction X in some cases.

The light-emitting device 1 is provided further with a second extracting electrode 8. The second extracting electrode 8 works as an electrode that is electrically connected to an external electric power supply. The second extracting electrode 8 is arranged away from the first electrode 4 and the first extracting electrode 7 and is electrically insulated from the first electrode 4 and the first extracting electrode 7, on the supporting substrate 2. In the present embodiment, the second extracting electrode 8 is arranged at a prescribed interval in the first direction X to the first electrode 4. As illustrated in FIG. 1A, the second extracting electrode 8 is arranged to be extended in the first direction X as well as in a second direction Y that is vertical to the first direction X. In the present specification, the first direction X and the second direction Y are vertically-directed each other, and each direction is vertical to the thickness direction Z of the supporting substrate 2.

The light-emitting device 1 is provided further with a connecting electrode 9 that connects the second electrode 6 and the second extracting electrode 8. The connecting electrode 9 is extended from the second electrode 6 and is connected to the second extracting electrode 8. The connecting electrode 9 in the present embodiment is provided to be extended in the first direction X, from an end of the second electrode 6 in the first direction X to reach on the second extracting electrode 8. That is, the connecting electrode 9 is integrally formed with the second electrode 6. Thus the connecting electrode 9 extends from the second electrode 6 to reach the second extracting electrode 8, and thereby the second electrode 6 and the second extracting electrode 8 are electrically connected through the connecting electrode 9. As described above, the organic EL layer 5 is formed so as to cover the first electrode 4. Therefore, as illustrated in FIG. 1B, the organic EL layer 5 is interposed between the connecting electrode 9 and the first electrode 4. Thus the organic EL layer 5 is interposed between the connecting electrode 9 and the first electrode 4, and thereby a physical and electrical connection between the connecting electrode 9 and the first electrode 4 can be prevented.

The second extracting electrode 8 is electrically connected to an external electric power supply in the same manner as in the case of the first extracting electrode 7, and thereby certain electric power is supplied from the external electric power supply to the second electrode 6 through the second extracting electrode 8 and the connecting electrode 9.

The light-emitting device 1 is provided further with a first heat-dissipating member 10 that is extended from the second electrode 6 on the supporting substrate 2. In the present embodiment, as illustrated in FIGS. 1A and 1C, the first heat-dissipating member 10 is composed of: a component 10a extended from one end of the second electrode 6 in the second direction Y along one direction of the second direction Y; and a component 10b extended from the other end of the second electrode 6 in the second direction Y along the other direction of the second direction Y. The component 10a and the component 10b of the first heat-dissipating member 10 are integrally formed with the second electrode 6. In the present embodiment, as illustrated in FIG. 1C, the components 10a and 10b are provided in contact with the supporting substrate 2. As described above, the organic EL layer 5 is formed so as to cover the first electrode 4. Therefore, as illustrated in FIG. 1C, the organic EL layer 5 interposes between the first heat-dissipating member 10 and the first electrode 4. Thus the organic EL layer 5 is interposed, and thereby a physical and electrical connection between the first heat-dissipating member 10 that is integrally formed with the second electrode 6 and the first electrode 4 can be prevented. In the present embodiment, as illustrated in FIG. 1A, the first heat-dissipating member 10 is formed so as not to overlap with the first extracting electrode 7 in a planar view. Therefore, the first heat-dissipating member is electrically insulated from the first electrode 4 and the first extracting electrode 7.

As explained above, the light-emitting device 1 of the present embodiment comprises the first heat-dissipating member 10 extended from the second electrode 6. While using the light-emitting device 1, the organic EL element 3 generates heat, and the heat generated at the element 3 diffuses from the second electrode 6 to the outside and also to the first heat-dissipating member 10. The heat diffused into the first heat-dissipating member 10 diffuses from the first heat-dissipating member 10 to the outside. Part of the heat diffused into the first heat-dissipating member 10 diffuses to the supporting substrate 2, and then diffuses from the supporting substrate 2 to the outside. Thus, by providing the first heat-dissipating member 10 extended from the second electrode 6, the heat generated at the organic EL element 3 can diffuse to the outside efficiently. As the result, in the light-emitting device 1 of the present embodiment, temperature increasing of the organic EL element 3 can be suppressed.

In order to ensure a space for the first heat-dissipating member 10, the light-emitting device may be made larger. However, for example, by providing the first heat-dissipating member 10 in an empty space that is inevitably created due to the design of the light-emitting device, upsizing of the light-emitting device due to the provided first heat-dissipating member 10 can be suppressed. Usually, an organic EL element is not provided all over a supporting substrate. Therefore, the space available for providing the first heat-dissipating member 10 can be ensured by devising the wiring design or the like. For example, by providing the first heat-dissipating member 10 in such a space, upsizing of the device can be suppressed.

The first heat-dissipating member 10 is preferably composed of a component excellent in heat conductive property. In the present embodiment, a heat conductive property of the first heat-dissipating member 10 is the same as that of the second electrode 6 that is integrally formed therewith. Therefore, the second electrode 6 is preferably composed of a component excellent in heat conductive property. The heat generated at the organic EL element 3 diffuses from the second electrode 6 through the first heat-dissipating member 10 to the outside, and therefore the product of a thermal conductivity and a film thickness of the second electrode is preferably greater than that of the first electrode. That is, when the product of a thermal conductivity and a film thickness of the component of the first electrode is defined as P1 and the product of a thermal conductivity and a film thickness of the component of the second electrode is defined as P2, the product ratio (P2/P1) preferably exceeds 1. More preferably, the product ratio (P2/P1) is 1.4 or more; more preferably, the product ratio is 5 or more; more preferably, the product ratio is 10 or more; further more preferably, the product ratio is 18 or more. As described above, in a bottom emission type organic EL element, the first electrode 4 is composed of an electrode having light transparency. Usually, the product of a thermal conductivity and a film thickness of a conductive material for a second electrode in which light transparency is not required is greater than that of a conductive material for a first electrode having light transparency. Therefore, in a bottom emission type organic EL element, the product of a thermal conductivity and a film thickness of a second electrode is usually greater than that of a first electrode. Thus, in a bottom emission type organic EL element, the first heat-dissipating member 10 can be provided and composed of a component excellent in heat conductive property without taking a specific design.

A thermal conductivity of the second electrode is preferably 30 W/(m·K) or more. Therefore, a thermal conductivity of the first heat-dissipating member that is integrally formed with the second electrode is preferably 30 W/(m·K) or more. In this way, the second electrode and the first heat-dissipating member are composed of a component having a high thermal conductivity, and thereby heat dissipation property of the light-emitting device can be improved. The second electrode and the first heat-dissipating member having a thermal conductivity of 30 W/(m·K) or more may be composed, for example, of a thin film containing aluminum (Al), copper (Cu), silver (Ag), gold (Au), iron (Fe), silicon (Si), or carbon (C).

A film thickness of the second electrode 6 is preferably 100 nm or more. Therefore, a film thickness of the first heat-dissipating member 10 that is integrally formed with the second electrode 6 is preferably 100 nm or more. In this way, a film thicknesses of the second electrode 6 and the first heat-dissipating member 10 becomes large; thereby, a heat conductivity of the second electrode 6 and the first heat-dissipating member 10 can be enhanced and also heat can be efficiently conducted from the second electrode 6 to the first heat-dissipating member 10. From the viewpoint of the heat dissipation property, a specific upper limit is not necessarily to set for a film thicknesses of the second electrode 6 and the first heat-dissipating member 10. However, for example, in consideration of the time required for forming the second electrode 6 and the first heat-dissipating member 10, the upper limit for a film thicknesses of the second electrode 6 and the first heat-dissipating member 10 are each about 200 μm.

<Manufacture of Light-Emitting Device>

Next, a method for manufacturing the light-emitting device 1 is explained. First, the supporting substrate 2 is prepared. When a bottom emission type organic EL element is mounted on the supporting substrate 2 as an organic EL element 3, a substrate having light transparency is used for the supporting substrate 2. As the supporting substrate 2, for example, a glass plate, a plastic plate, a macromolecular film, a silicon plate, a stacked body thereof, or the like may be employed.

Next, the first electrode 4, the first extracting electrode 7, and the second extracting electrode 8 are formed on the supporting substrate 2. These may be formed, for example, by forming a conductive thin film on the supporting substrate 2, followed by patterning of the conductive thin film by photolithography method into a prescribed shape.

The first electrode 4, the first extracting electrode 7, and the second extracting electrode 8 are preferably formed of the same component. This is because all of the first electrode 4, the first extracting electrode 7, and the second extracting electrode 8 may be formed in one step, and therefore the steps required for manufacturing the device can be simplified. The first electrode 4, the first extracting electrode 7, and the second extracting electrode 8 may be formed, for example, of a component that constitutes an anode or a cathode as described below.

The first extracting electrode 7 and the second extracting electrode 8 are preferably composed of a component excellent in adhesion to the supporting substrate 2. In order to inhibit the deterioration of the organic EL element 3, sealing is usually performed on a light-emitting device. Sealing is performed, for example, by preparing a prescribed sealing substrate, placing an adhesive on a periphery portion of the sealing substrate, and bonding the sealing substrate to the supporting substrate. Even when the sealing substrate and the supporting substrate are thus bonded to each other, the adhesion of the first extracting electrode 7 and the second extracting electrode 8 to the supporting substrate 2 could be poor, potentially leading degradation in hermeticity at a region to which sealing is performed due to the first extracting electrode 7 and the second extracting electrode 8. In contrast to this, the first extracting electrode 7 and the second extracting electrode 8 are composed of a component excellent in adhesion to the supporting substrate 2, and thereby, when sealing, hermeticity at the region to which sealing is performed can be enhanced. For example, in the case where the supporting substrate is composed of a glass substrate, examples of a material having high adhesion to the glass substrate may include indium tin oxide (ITO), chromium (Cr), or molybdenum (Mo). Therefore, when using a supporting substrate composed of a glass substrate, the first extracting electrode 7 and the second extracting electrode 8 are preferably formed of any of these materials having high adhesion.

Next, the organic EL layer 5 is formed. As described above, the organic EL layer 5 is formed so as to cover the first electrode 4. An area (the first extracting electrode 7) extended from the first electrode 4 in a planar view may be formed to ensure electrical insulation among the given components (the second electrode 6, the connecting electrode 9, the second extracting electrode 8, and the first heat-dissipating member 10). Therefore, when two or more organic EL layers 5 are provided, all the organic EL layers may be formed so as to cover the first electrode 4 in a planar view, or only an organic EL layer, for example, having a high electrical insulating property, among these organic EL layers may be formed so as to cover the first electrode 4 in a planar view with the rest of the organic EL layers being formed only on the first electrode 4.

Next, the second electrode 6, the connecting electrode 9, and the first heat dissipation member 10 are formed. These may be formed, for example, by arranging, on the supporting substrate 2, a mask in which an opening is formed at a prescribed area, and depositing a prescribed material through the mask. The second electrode 6, the connecting electrode 9, and the first heat-dissipating member 10 may be formed, for example, from a material that constitutes an anode or a cathode as described below.

Second Embodiment

Figure 2A:
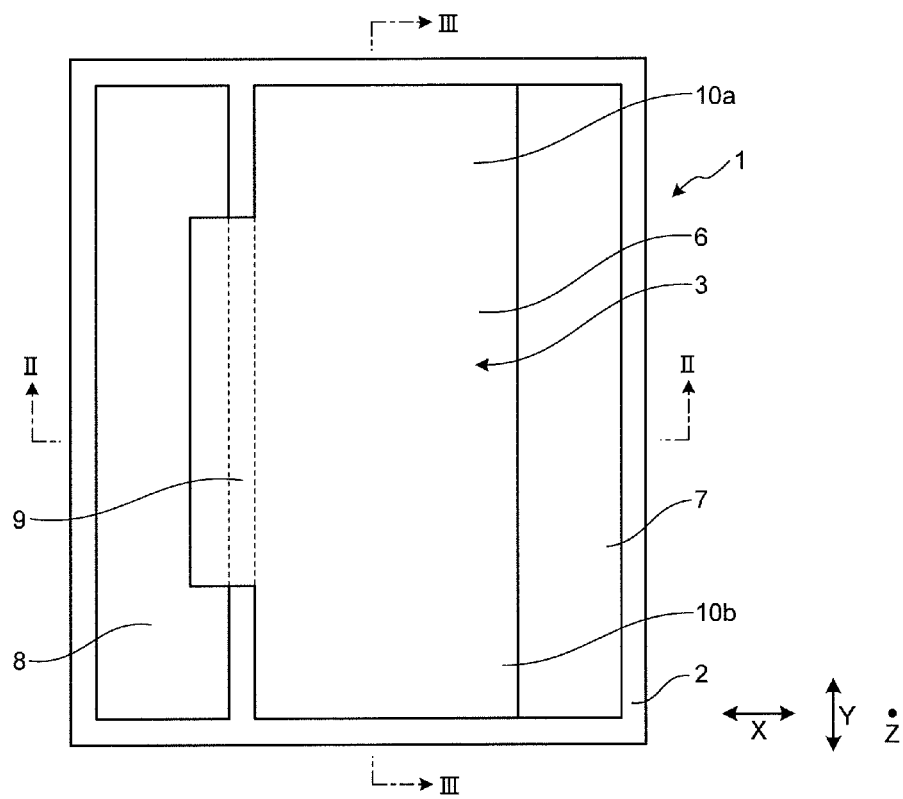
FIG. 2A is a plan view to schematically illustrate the light-emitting device 1 of a second embodiment of the present invention.
Figure 2B:
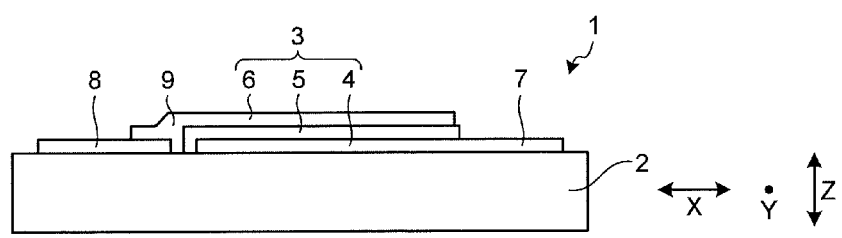
FIG. 2B is a cross-sectional view of the light-emitting device 1 of a second embodiment of the present invention at a cross-sectional line II-II in FIG. 2A.
Figure 2C:
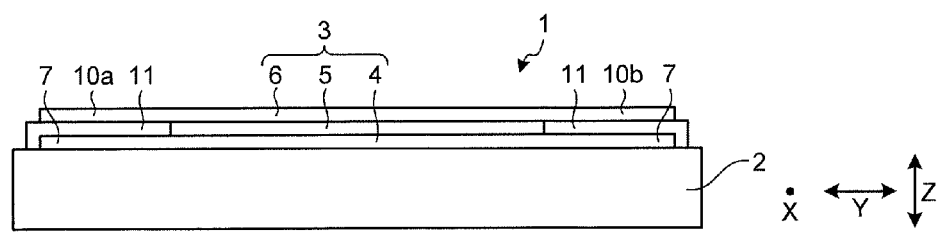
FIG. 2C is a cross-sectional view of the light-emitting device 1 of a second embodiment of the present invention at a cross-sectional line III-III in FIG. 2A.

In the above-mentioned first embodiment, the first heat-dissipating member 10 and the first extracting electrode 7 are arranged so as not to overlap one another in a planar view, as illustrated in FIG. 1A. Therefore, in the first embodiment, electrical insulation between the first heat-dissipating member 10 and the first extracting electrode 7 can be ensured without a special insulating component to be arranged. From the viewpoint of the heat dissipation property, however, the first extracting electrode 7 preferably extends in a planar view to reach a position where the first extracting electrode 7 overlaps with the first heat-dissipating member 10. FIGS. 2A, 2B, and 2C are each a view to schematically illustrate a light-emitting device 1 in which the first extracting electrode 7 extends to reach a position where the first extracting electrode 7 overlaps with the first heat-dissipating member 10, that is, to reach a position where the first extracting electrode 7 overlaps the components 10a and 10b.

FIG. 2A is a plan view of the light-emitting device 1 of a second embodiment of the present invention; FIG. 2B is a cross-sectional view of the light-emitting device 1 at a cross-sectional line II-II in FIG. 2A; and FIG. 2C is a cross-sectional view of the light-emitting device 1 at a cross-sectional line III-III in FIG. 2A.

The shapes of some constituents (the first extracting electrode 7, for example) in the second embodiment illustrated in FIGS. 2A, 2B, and 2C are different from ones in the light-emitting device of the first embodiment illustrated in FIGS. 1A, 1B, and 1C. Other than the shapes, the functions of the constituents in the light-emitting device of the present invention are same, and therefore the same numerals as those in FIGS. 1A, 1B, and 1C are used in FIGS. 2A, 2B, and 2C. In the light-emitting device 1 of the second embodiment illustrated in FIGS. 2A, 2B, and 2C, members corresponding to those in the light-emitting device 1 of the first embodiment illustrated in FIGS. 1A, 1B, and 1C are provided with the same numeral as in the light-emitting device of the first embodiment, and an overlapping explanation is omitted, in some cases. These also apply to a third embodiment, a fourth embodiment, and a fifth embodiment as described below.

In the light-emitting device 1 of the second embodiment illustrated in FIGS. 2A, 2B, and 2C, the structure of the first extracting electrode 7 is different from that in the light-emitting device 1 of the first embodiment illustrated in FIGS. 1A, 1B, and 1C. The light-emitting device of the second embodiment further includes an electrically-insulating film 11 that is required due to the difference of the shape in the first extracting electrodes 7.

The first extracting electrode 7 of the second embodiment is formed so as to be extend from the residual periphery portion among the periphery portions of the first electrode 4 except for the end thereof on the side of the second extracting electrode 8. That is, the first extracting electrode 7 is formed to be extended in the second direction Y, from one end and the other end of the first electrode 4 in the second direction Y. In the first extracting electrode 7, an area extended from the first electrode 4 in the second direction Y overlaps with the first heat-dissipating member 10 (the components 10a and 10b) in a planar view. In other words, at least a part of the first heat-dissipating member 10 overlaps with the first extracting electrode 7 in a planar view. In the second embodiment, as illustrated in FIG. 2C, the electrically-insulating film 11 is provided between the first heat-dissipating member 10 and the first extracting electrode 7 at a portion where the first heat-dissipating member 10 and the first extracting electrode 7 overlap in a planar view. By providing the electrically-insulating film 11, electrical insulation between the first heat-dissipating member 10 and the first extracting electrode 7 can be ensured.

In the second embodiment, the electrically-insulating film 11 is formed prior to a step of forming the second electrode 6. The electrically-insulating film 11 may be formed after forming the organic EL layer 5 or prior to forming the organic EL layer 5. However, it is preferably formed prior to forming the organic EL layer 5, because damage given to the organic EL layer 5 during the step of forming the electrically-insulating film 11 can be prevented. For example, the electrically-insulating film 11 may be patterned by photolithography method using a photo-setting resin. Alternatively, the electrically-insulating film 11 may be patterned using, for example, silicon oxide ($SiO_2$), silicon nitride (SiN), titanium oxide ($TiO_2$), titanium nitride (TiN), or the like by a vacuum deposition method, a sputtering method, a plasma CVD method, an ion plating method, or a similar method.

As explained above, in the second embodiment, the first extracting electrode 7 extends to reach an area where the first extracting electrode 7 partly overlaps the first heat-dissipating member 10, thereby increasing a surface area of the first extracting electrode 7. As the result, part of the heat generated at the organic EL element 3 can diffuse to the second extracting electrode 7 having a large surface extended from the first electrode 4 in the second direction Y. The heat diffused to one and the other directions in the second direction Y of the second extracting electrode 7 in both diffuses from the surface of the first extracting electrode 7 to the outside. Further, part of the heat diffused to the first extracting electrode 7 also diffuses into the supporting substrate and then to the outside. In this way, in the second embodiment, the first extracting electrode 7 is extended to reach an area where the first extracting electrode 7 overlaps the first heat-dissipating member 10, and thereby temperature increasing of the organic EL element 3 can be efficiently suppressed.

Third Embodiment

Figure 3A:
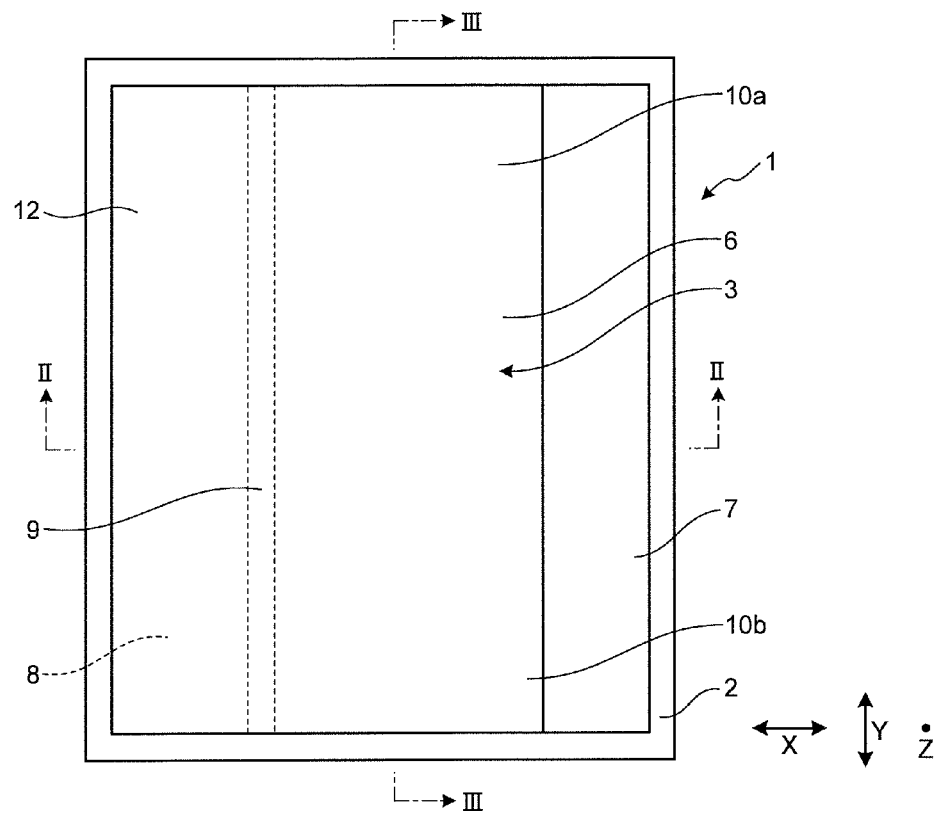
FIG. 3A is a plan view to schematically illustrate the light-emitting device 1 of a third embodiment of the present invention.
Figure 3B:
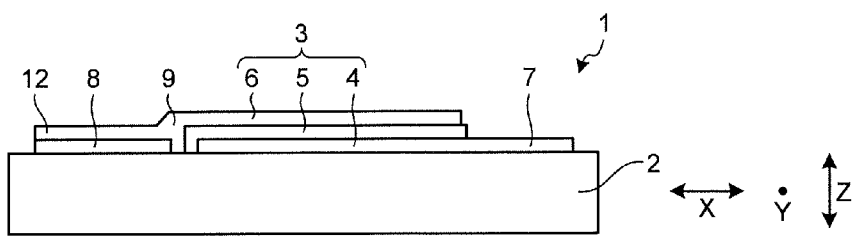
FIG. 3B is a cross-sectional view of the light-emitting device 1 of a third embodiment of the present invention at a cross-sectional line II-II in FIG. 3A.
Figure 3C:
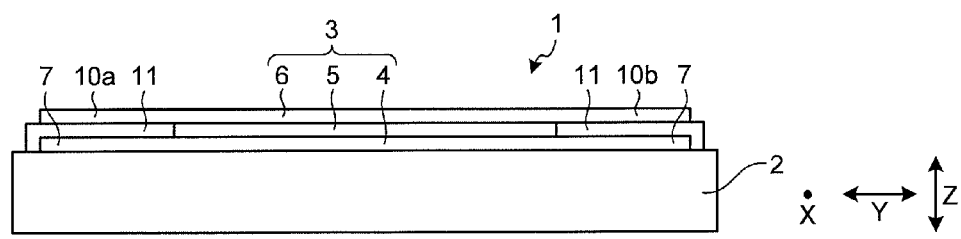
FIG. 3C is a cross-sectional view of the light-emitting device 1 of a third embodiment of the present invention at a cross-sectional line III-III in FIG. 3A.

FIGS. 3A, 3B, and 3C are each a view to schematically illustrate a light-emitting device 1 of a third embodiment of the present invention. FIG. 3A is a plan view of the light-emitting device 1, FIG. 3B is a cross-sectional view of the light-emitting device 1 at a cross-sectional line II-II in FIG. 3A, and FIG. 3C is a cross-sectional view of the light-emitting device 1 at a cross-sectional line III-III in FIG. 3A. The light-emitting device 1 of the third embodiment is provided further with a second heat-dissipating member 12 in addition to each of the light-emitting devices of the first and the second embodiments. FIGS. 3A, 3B, and 3C each illustrates the light-emitting device 1 of the second embodiment illustrated in FIGS. 2A, 2B, and 2C to which the second heat-dissipating member 12 is provided. Also, the third embodiment includes the light-emitting device 1 of the first embodiment illustrated in FIGS. 1A, 1B, and 1C to which the second heat-dissipating member 12 is provided.

In the light-emitting device 1 of the third embodiment illustrated in FIGS. 3A, 3B, and 3C, members corresponding to those in the light-emitting device 1 of the second embodiment illustrated in FIGS. 2A, 2B, and 2C are provided with the same numeral as in the light-emitting device of the second embodiment, and an overlapping explanation is omitted, in some cases.

As illustrated in FIGS. 3A and 3B, the light-emitting device 1 of the third embodiment is provided further with the second heat-dissipating member 12 that is extended from the connecting electrode 9 on the second extracting electrode 8. The second heat-dissipating member 12 of the third embodiment is formed on the second extracting electrode 8 to be extended from the periphery of the connecting electrode 9 of the second embodiment illustrated in FIGS. 2A, 2B, and 2C.

While using the light-emitting device 1, the organic EL element 3 generates heat. The heat generated at the element 3 diffuses from the second electrode 6 to the first heat-dissipating member 10 and also diffuses to the second heat-dissipating member 12. And then, the heat diffused into the second heat-dissipating member 12 further diffuses from the second heat-dissipating member 12 to the outside. Thus, in the light-emitting device 1 of the third embodiment, the second heat-dissipating member 12 that diffuses heat to the outside is provided further, and thereby temperature increasing of the organic EL element 3 can be further suppressed.

Fourth Embodiment

Figure 4A:
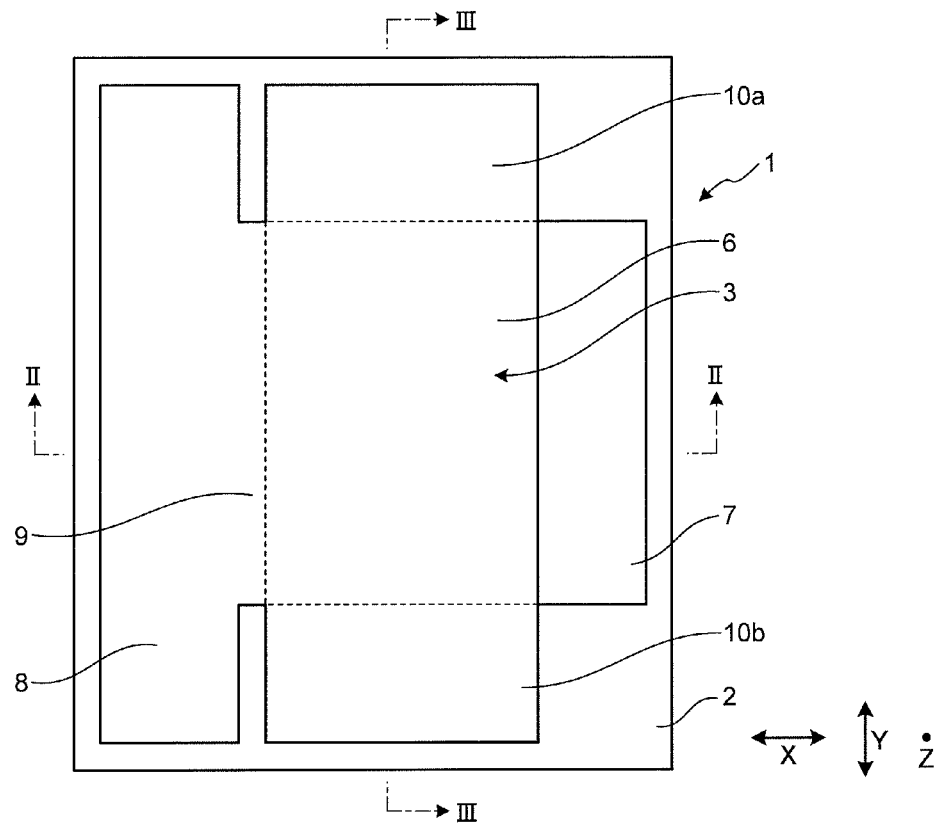
FIG. 4A is a plan view to schematically illustrate the light-emitting device 1 of a fourth embodiment of the present invention.
Figure 4B:
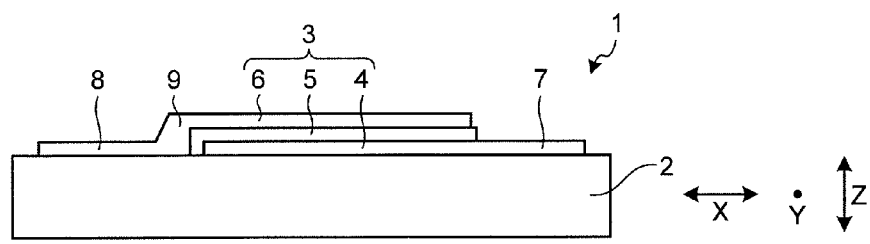
FIG. 4B is a cross-sectional view of the light-emitting device 1 of a fourth embodiment of the present invention at a cross-sectional line II-II in FIG. 4A.
Figure 4C:
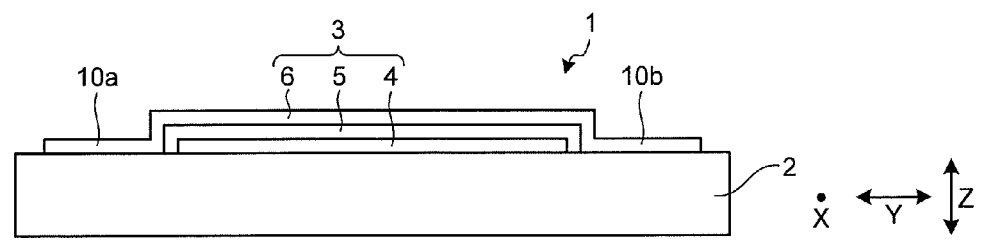
FIG. 4C is a cross-sectional view of the light-emitting device 1 of a fourth embodiment of the present invention at a cross-sectional line III-III in FIG. 4A.

In the abovementioned light-emitting devices of the first, the second, and the third embodiments, the connecting electrode 9 and the second extracting electrode 8 are separate components. The connecting electrode 9 is extended from the second electrode 6 to reach the second extracting electrode 8 and is electrically connected to the second extracting electrode 8. In contrast to this, in a light-emitting device of a fourth embodiment, the connecting electrode 9 and the second extracting electrode 8 are integrally formed. FIGS. 4A, 4B, and 4C are each a view to schematically illustrate the light-emitting device 1 of the fourth embodiment. FIG. 4A is a plan view of the light-emitting device 1, FIG. 4B is a cross-sectional view of the light-emitting device 1 at a cross-sectional line II-II in FIG. 4A, and FIG. 4C is a cross-sectional view of the light-emitting device 1 at a cross-sectional line III-III in FIG. 4A. In the light-emitting device 1 of the fourth embodiment illustrated in FIGS. 4A, 4B, and 4C, the connecting electrode 9 is extended from an end of the second electrode 6, and the second extracting electrode 8 is extended from the periphery portion of the connecting electrode 9. Therefore, the second electrode 6, the connecting electrode 9, and the second extracting electrode 8 are integrally formed.

The second extracting electrode 8 is formed prior to forming the organic EL layer 3 in the first embodiment to the third embodiment, while in the fourth embodiment, the second extracting electrode 8 is formed in the same step as that of forming the second electrode 6 and the connecting electrode 9.

As described above, in a bottom emission type organic EL element, because the second electrode 6 usually has a higher heat dissipation property, the second extracting electrode 8 is formed of the same component as that of the second electrode 6, and thereby the heat dissipation property of the light-emitting device can be further enhanced.

Fifth Embodiment

Figure 5A:
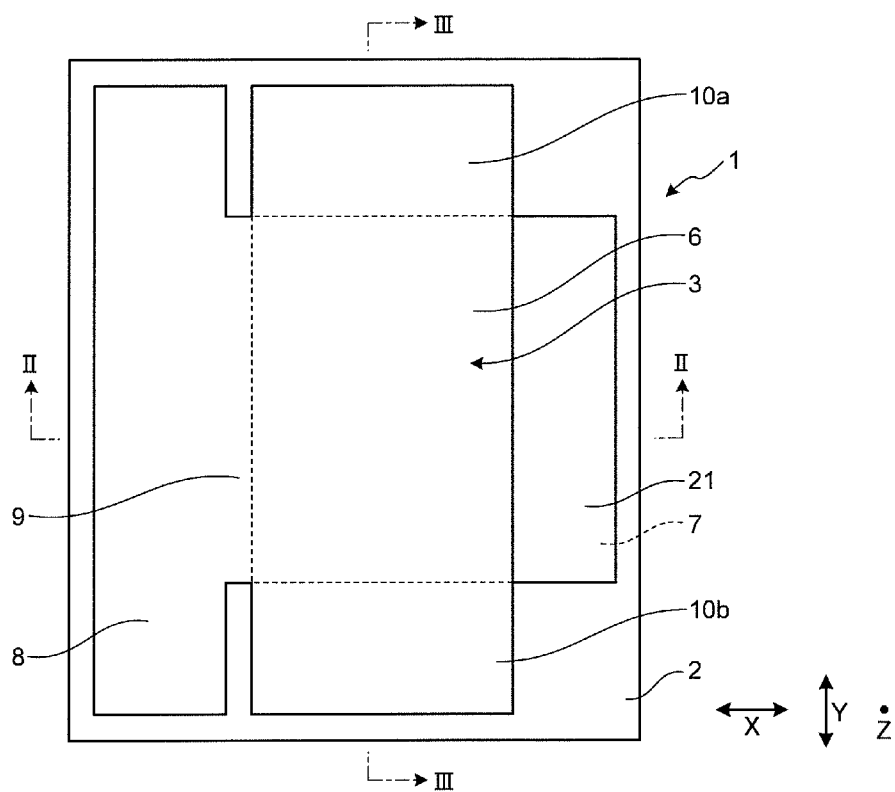
FIG. 5A is a plan view to schematically illustrate the light-emitting device 1 of a fifth embodiment of the present invention.
Figure 5B:
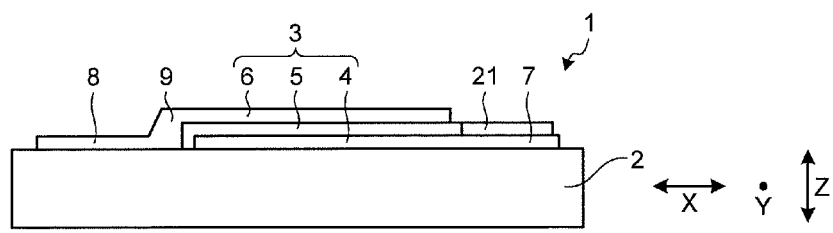
FIG. 5B is a cross-sectional view of the light-emitting device 1 of a fifth embodiment of the present invention at a cross-sectional line II-II in FIG. 5A.
Figure 5C:
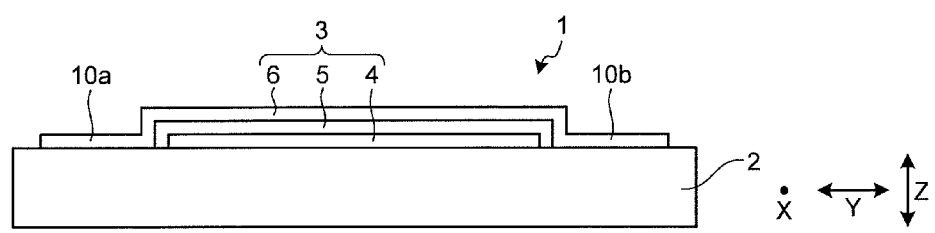
FIG. 5C is a cross-sectional view of the light-emitting device 1 of a fifth embodiment of the present invention at a cross-sectional line III-III in FIG. 5A.

A light-emitting device of a fifth embodiment of the present invention is provided further with a subsidiary heat-dissipating member that is provided in contact with the first extracting electrode. FIGS. 5A, 5B, and 5C illustrate the light-emitting device 1 of the fifth embodiment as an example of a light-emitting device provided with a subsidiary heat-dissipating member. FIG. 5A is a plan view of the light-emitting device 1, FIG. 5B is a cross-sectional view of the light-emitting device 1 at a cross-sectional line II-II in FIG. 5A, and FIG. 5C is a cross-sectional view of the light-emitting device 1 at a cross-sectional line III-III in FIG. 5A. This subsidiary heat-dissipating member 21 is provided, for example, in addition to the constituents in the light-emitting devices of the first embodiment to the fourth embodiment. The product of a thermal conductivity and a film thickness of the subsidiary heat-dissipating member 21 is greater than that of the first extracting electrode 7. The subsidiary heat-dissipating member 21 may be in contact with either one surface of the two principal surfaces of the first extracting electrode 7, and also, may be in contact with both surfaces of the principal surfaces. FIGS. 5A, 5B, and 5C each illustrates the case where the subsidiary heat-dissipating member 21 is in contact with either one surface of the two principal surfaces of the first extracting electrode 7. That is, in FIGS. 5A, 5B, and 5C, the subsidiary heat-dissipating member 21 is in contact with a surface of the first extracting electrode 7, wherein the surface is in the side opposing to the substrate 2. As described above, in a bottom emission type organic EL element, as well as the first electrode, the first extracting electrode is also composed of an electrode having light transparency, and the subsidiary heat-dissipating member 21 that is in contact with the first extracting electrode 7 is not located in an area where the light emits; therefore, the subsidiary heat-dissipating member 21 is not necessary composed of a material having light transparency. Usually, an electrode having light transparency is not always excellent in the heat dissipation property, and therefore heat dissipation from an electrode having light transparency is not large. However, in the fifth embodiment, a subsidiary heat-dissipating member 21 thermally connected to the first electrode 4 that is an electrode having light transparency is provided with a material having an excellent heat dissipation property at an area where the light transparency is not required, and thereby the heat dissipation property of the light-emitting device can be further enhanced. The subsidiary heat-dissipating member 21 in which the product of a thermal conductivity and a film thickness is larger than that of the first extracting electrode 7 also works as an auxiliary electrode for the first extracting electrode 7. Thus, by providing such a subsidiary heat-dissipating member 21, the light-emitting efficiency of the light-emitting device can be improved.

(Structure of Organic EL Element)

A layer structure of an organic EL element used as a light source of the light-emitting device in the first embodiment to the fifth embodiment, the structure of each layer, and the method of forming each layer are explained below in further detail.

As described above, an organic EL element comprises a pair of electrodes composed of an anode and a cathode (first and second electrodes) and one or more organic EL layers interposed between the electrodes. For one or more organic EL layers, at least one light-emitting layer is included. The organic EL element may have a layer containing both an inorganic substance and an organic substance, an inorganic layer, and the like. The organic substance that constitutes the organic layer may be a low molecular compound, a macromolecular compound, or a mixture of a low molecular compound and a macromolecular compound. The organic layer preferably contains a macromolecular compound, preferably contains a macromolecular compound having a number average molecular weight of $10^3$ to $10^8$ in terms of polystyrene.

The organic EL layer interposed between the cathode and the light-emitting layer may be the electron injection layer, the electron transport layer, the hole block layer, or the like. In the case where both of the electron injection layer and the electron transport layer are interposed between the cathode and the light-emitting layer, the layer closer to the cathode is called the electron injection layer, while the layer closer to the light-emitting layer is called the electron transport layer. The organic EL layer interposed between the anode and the light-emitting layer may be the hole injection layer, the hole transport layer, the electron block layer, or the like. In the case where both of the hole injection layer and the hole transport layer are provided, the layer closer to the anode is called the hole injection layer, while the layer closer to light-emitting layer is called the hole transport layer.

Examples of layer structures applicable to the organic EL element used as the light source of the light-emitting device of the present invention are illustrated as follows.

a) anode/light-emitting layer/cathode
b) anode/hole injection layer/light-emitting layer/cathode
c) anode/hole injection layer/light-emitting layer/electron injection layer/cathode d) anode/hole injection layer/light-emitting layer/electron transport layer/cathode
e) anode/hole injection layer/light-emitting layer/electron transport layer/electron injection layer/cathode
f) anode/hole transport layer/light-emitting layer/cathode
g) anode/hole transport layer/light-emitting layer/electron injection layer/cathode
h) anode/hole transport layer/light-emitting layer/electron transport layer/cathode
i) anode/hole transport layer/light-emitting layer/electron transport layer/electron injection layer/cathode
j) anode/hole injection layer/hole transport layer/light-emitting layer/cathode
k) anode/hole injection layer/hole transport layer/light-emitting layer/electron injection layer/cathode
l) anode/hole injection layer/hole transport layer/light-emitting layer/electron transport layer/cathode
m) anode/hole injection layer/hole transport layer/light-emitting layer/electron transport layer/electron injection layer/cathode
n) anode/light-emitting layer/electron injection layer/cathode
o) anode/light-emitting layer/electron transport layer/cathode
p) anode/light-emitting layer/electron transport layer/electron injection layer/cathode (Here, the symbol "/" indicates that the layers at both sides of the symbol "/" are layered adjacent to each other. The same applies to the description below.)

An organic EL element used as the light source of the light-emitting device of the present invention may also have two or more light-emitting layers. In any one of the above layer structures a) to p), when a stacked body interposed between an anode and a cathode is defined as "structural unit A", as the structure of the organic EL element having two light-emitting layers, the following layer structure of q) may be included. The layer structures of the two (structural units A) may be the same or different from each other.

q) anode/(structural unit A)/charge generation layer/(structural unit A)/cathode When "(structural unit A)/charge generation layer" is defined as "structural unit B", as a structure of the organic EL element having three or more light-emitting layers, the following layer structure of r) may be included.

r) anode/(structural unit B)x/(structural unit A)/cathode

In this structure, a symbol "x" is an integer of two or more, and (structural unit B)x is a stacked body in which the structural unit B is stacked x times. A plurality of layer structures of the "structural units B" may be the same or different from each other.

The charge generation layer is a layer generating holes and electrons when electric field is applied thereto. Examples of the charge generation layer include a thin film made of vanadium oxide, indium tin oxide (ITO), molybdenum oxide, or the like.

In the organic EL element, regarding the pair of electrodes composed of the anode and the cathode, the anode may be arranged on the supporting substrate closer to the supporting substrate compared to the cathode, or the cathode may be arranged on the supporting substrate closer to the supporting substrate compared to the anode. For example, in a) to r) described above, each layer from the right end may be stacked on the supporting substrate in the order to constitute the organic EL element, or each layer from the left end may be stacked on the supporting substrate in the order to constitute the organic EL element. The order of the layers to be stacked, the number of the layers, and the thickness of each layer (film thickness) may be designed as appropriate in consideration of light-emitting efficiency and the element life.

Next, materials for each layer that constitutes the organic EL element and a method for forming the layers are more specifically explained.

<Anode>

When the organic EL element has a structure in which light emitted from a light-emitting layer emits through an anode to the outside of the element, an electrode having light transparency is used for the anode. As the electrode having light transparency, a thin film of a metal oxide, a metal sulfide, a metal, or the like may be used, and those having high electric conductivity and high light transparency may be preferably used. Specifically, a thin film made of indium oxide, zinc oxide, tin oxide, ITO, indium zinc oxide (IZO), gold, platinum, silver, copper, or the like may be used. Among them, a thin film made of ITO, IZO, or tin oxide may be preferably used.

Examples of a method of manufacturing the anode may include a vacuum deposition method, a sputtering method, an ion plating method, and a plating method. As the anode, an organic transparent conductive film of a polyaniline or a derivative thereof, a polythiophene or a derivative thereof, or the like may be used.

A film thickness of the anode is appropriately designed in consideration of properties required, ease of the film formation step, and the like. A film thickness of the anode is, for example, 10 nm to 10 μm.

<Cathode>

A preferred material for the cathode has a small work function, facilitates electron injection into the light-emitting layer, and has a high electric conductivity. In the organic EL element in which light is extracted from the anode, a material for the cathode preferably has a high visible light reflectance because the cathode reflects the light emitted from the light-emitting layer to the anode. For example, an alkali metal, an alkaline-earth metal, a transition metal, a Group 13 metal in the periodic table, and the like may be used for the cathode. Examples of the material for the cathode to be used may include: metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; alloys of two or more species of the above metals; alloys of one or more species of the above metals and one or more species from gold, silver, platinum, copper, manganese, titanium, cobalt, nickel, tungsten, and tin; and graphites and graphite intercalation compounds. Examples of the alloy may include magnesium-silver alloys, magnesium-indium alloys, magnesium-aluminum alloys, indium-silver alloys, lithium-aluminum alloys, lithium-magnesium alloys, lithium-indium alloys, and calcium-aluminum alloys. As the cathode, a transparent conductive electrode made of a conductive metal oxide, a conductive organic substance, or the like may be used. Specific examples of the conductive metal oxide may include indium oxide, zinc oxide, tin oxide, ITO, and IZO. Examples of the conductive organic substance may include polyanilines or derivatives thereof, and polythiophenes or derivatives thereof. The cathode may be a stacked body in which two or more layers are stacked. An electron injection layer may be used as the cathode.

A film thickness of the cathode is appropriately designed in consideration of properties required, ease of the film formation step, and the like. A film thickness of the cathode is, for example, 10 nm to 10 μm.

Examples of a method of manufacturing the cathode may include a vacuum deposition method, a sputtering method, and a lamination method by which a metal thin film is thermocompression bonded.

<Hole Injection Layer>

Examples of a hole injection material for the hole injection layer may include oxides such as vanadium oxide, molybdenum oxide, ruthenium oxide, and aluminum oxide; phenylamine compounds; starburst-type amine compounds; phthalocyanine compounds; amorphous carbons; polyanilines; and polythiophene derivatives.

A film thickness of the hole injection layer is appropriately designed in consideration of properties required, ease of the film formation step, and the like. A film thickness of the hole injection layer is, for example, 1 nm to 1 μm, is preferably 2 nm to 500 nm, and is more preferably 5 nm to 200 nm.

<Hole Transport Layer>

Examples of a hole transport material for the hole transport layer may include polyvinylcarbazoles or derivatives thereof, polysilanes or derivatives thereof, polysiloxane derivatives having an aromatic amine on a side chain or the main chain, pyrazoline derivatives, arylamine derivatives, stilbene derivatives, triphenyldiamine derivatives, polyanilines or derivatives thereof, polythiophenes or derivatives thereof, polyarylamines or derivatives thereof, polypyrroles or derivatives thereof, poly(p-phenylene vinylene) or derivatives thereof, or poly(2,5-thienylene vinylene) or derivatives thereof.

A film thickness of the hole transport layer is designed in consideration of properties required, ease of the film formation step, and the like. A film thickness of the hole transport layer is, for example, 1 nm to 1 μm, is preferably 2 nm to 500 nm, and is more preferably 5 nm to 200 nm.

<Light-Emitting Layer>

The light-emitting layer is usually mainly formed from an organic substance that emits fluorescence and/or phosphorescence, or from the organic substance and a dopant assisting the organic substance. The dopant is added in order to improve light-emitting efficiency and change an emission wavelength, for example. The organic substance constituting the light-emitting layer may be a low molecular compound or a macromolecular compound, and in the case of forming the light-emitting layer by a coating method, the light-emitting layer preferably contains a macromolecular compound. The number average molecular weight of the macromolecular compound constituting the light-emitting layer is, for example, about $10^3$ to $10^8$ in terms of polystyrene. Examples of the light-emitting material of the light-emitting layer may include pigment materials, metal complex materials, macromolecular materials, and dopant materials to be described below.

(Pigment Materials)

Examples of a pigment material may include cyclopentamine derivatives, tetraphenyl butadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, pyrazoline dimers, quinacridone derivatives, and coumarin derivatives.

(Metal Complex Materials)

Examples of a metal complex material may include metal complexes having as a central metal, a rare-earth metal such as Tb, Eu, and Dy, Al, Zn, Be, Ir, Pt, or the like and having as a ligand, a structure of oxadiazole, thiadiazole, phenylpyridine, phenylbenzimidazole, quinoline, or the like. Examples of the metal complex may include metal complexes that emit light from the triplet excited state such as iridium complexes and platinum complexes; aluminum-quinolinol complexes; benzoquinolinol beryllium complexes; benzoxazolyl zinc complexes; benzothiazole zinc complexes; azomethyl zinc complexes; porphyrin zinc complexes; and phenanthroline europium complexes.

(Macromolecular Materials)

Examples of a macromolecular material may include polyparaphenylene vinylene derivatives, polythiophene derivatives, polyparaphenylene derivatives, polysilane derivatives, polyacetylene derivatives, polyfluorene derivatives, polyvinylcarbazole derivatives, and polymerized materials of the pigment materials or the metal complex light-emitting materials described above.

A thickness of the light-emitting layer is usually about 2 nm to 200 nm.

<Electron Transport Layer>

As the electron transport material for an electron transport layer, known electron transport materials may be used. Examples of the electron transport material may include oxadiazole derivatives, anthraquinodimethanes or derivatives thereof, benzoquinones or derivatives thereof, naphthoquinones or derivatives thereof, anthraquinones or derivatives thereof, tetracyanoanthraquinodimethane or derivatives thereof, fluorenone derivatives, diphenyldicyanoethylene or derivatives thereof, diphenoquinone derivatives, metal complexes of 8-hydroxyquinoline or of derivatives of 8-hydroxyquinoline, polyquinolines or derivatives thereof, polyquinoxalines or derivatives thereof, or polyfluorenes or derivatives thereof.

A film thickness of the electron transport layer is appropriately designed in consideration of properties required, ease of the film formation step, and the like. A film thickness of the electron transport layer is, for example, 1 nm to 1 μm, is preferably 2 nm to 500 nm, and is more preferably 5 nm to 200 nm.

<Electron Injection Layer>

As the material for an electron injection layer, an optimum material is selected as appropriate depending on the types of the light-emitting layer. Examples of the material for the electron injection layer may include: alkali metals; alkaline-earth metals; alloys that contain one or more species of alkali metals and alkaline-earth metals; oxides, halides, or carbonates of alkali metals or alkaline-earth metals; or a mixture of these substances. Examples of the alkali metals, the oxides, the halides, and the carbonates of alkali metals may include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. Examples of the alkaline-earth metals, the oxides, the halides, and the carbonates of alkaline-earth metals may include magnesium, calcium, barium, strontium, magnesium oxide, magnesium fluoride, calcium oxide, calcium fluoride, barium oxide, barium fluoride, strontium oxide, strontium fluoride, and magnesium carbonate. The electron injection layer may also be a stacked body in which two or more layers are stacked. Examples of the stacked body may include a stacked body of LiF/Ca.

A film thickness of the electron injection layer is preferably about 1 nm to 1 μm.

Each of the organic EL layers described above may be formed, for example, by a coating method such as a spin coating method, an ink jet printing method, a CAP coating method, a nozzle printing method, a letterpress printing method, and an intaglio printing method, or a vacuum deposition method, a lamination method, a spray coating method, a slit die coating method, or a similar method.

In the coating method, an ink containing an organic EL material to become each organic EL layer is applied for film formation to form an organic EL layer. As a solvent for the ink used for forming an organic EL layer, the following may be used, for example: a chlorine based solvent such as chloroform, methylene chloride, and dichloroethane; an ether based solvent such as tetrahydrofura; an aromatic hydrocarbon based solvent such as toluene and xylene; a ketone based solvent such as acetone and methyl ethyl ketone; an ester based solvent such as ethyl acetate, butyl acetate, and ethyl cellosolve acetate; water.

EXPLANATIONS OF LETTERS OR NUMERALS

1 light-emitting device
2 supporting substrate
3 organic EL element
4 first electrode
5 organic EL layer
6 second electrode
7 first extracting electrode
8 second extracting electrode
9 connecting electrode
10 first heat-dissipating member
11 electrically-insulating film
12 second heat-dissipating member

The invention claimed is:

1. A light-emitting device, comprising:
   a supporting substrate;
   an organic electroluminescent element comprising a first electrode, one or more organic electroluminescent layers and a second electrode that are layered in this order on the supporting substrate;
   a first extracting electrode for electrically connecting to an external electric power supply, that is integrally formed and extended from the first electrode on the supporting substrate;
   a second extracting electrode for electrically connecting to an external electric power supply, that is arranged away from the first electrode and the first extracting electrode on the supporting substrate;
   a connecting electrode that is integrally formed and extended from the second electrode and that is connected to the second extracting electrode, on the supporting substrate; and
   a first heat-dissipating member that is integrally formed and extended from the second electrode and that is insulated electrically from the first electrode and the first extracting electrode, on the supporting substrate.

2. The light-emitting device according to claim 1, further comprising a second heat-dissipating member, that is integrally formed and extended from the connecting electrode on the second extracting electrode.

3. The light-emitting device according to claim 1, wherein
   a part or all of the first heat-dissipating member is arranged in a manner of overlapping with the first extracting electrode as viewed from a thickness direction of the supporting substrate, and
   an electrically-insulating film is arranged between the first heat-dissipating member and the first extracting electrode on an area where the first heat-dissipating member and the first extracting electrode overlap, as viewed from a thickness direction of the supporting substrate.

4. The light-emitting device according to claim 1, wherein a product of a thermal conductivity and a thickness of the second electrode is larger than that of the first electrode.

5. The light-emitting device according to claim 1, further comprising a subsidiary heat-dissipating member that is arranged in contact with the first extracting electrode, wherein a product of a thermal conductivity and a thickness of the subsidiary heat-dissipating member is larger than that of the first extracting electrode.

6. The light-emitting device according to claim 1, wherein a thermal conductivity of the second electrode is equal to or more than 30 W/mk.

7. The light-emitting device according to claim 1, wherein a thickness of the second electrode is equal to or more than 100 nm.

* * * * *